US012571099B2

(12) United States Patent
Takahashi et al.

(10) Patent No.: US 12,571,099 B2
(45) Date of Patent: Mar. 10, 2026

(54) BIS(ETHYLCYCLOPENTADIENYL)TIN, PRECURSOR FOR CHEMICAL VAPOR DEPOSITION, METHOD OF PRODUCING TIN-CONTAINING THIN FILM, AND METHOD OF PRODUCING TIN OXIDE THIN FILM

(71) Applicant: KOJUNDO CHEMICAL LABORATORY CO., LTD., Sakado (JP)

(72) Inventors: Nobutaka Takahashi, Sakado (JP); Fumikazu Mizutani, Sakado (JP); Shintaro Higashi, Sakado (JP)

(73) Assignee: KOJUNDO CHEMICAL LABORATORY CO., LTD., Sakado (JP)

(*) Notice: Subject to any disclaimer, the term of this patent is extended or adjusted under 35 U.S.C. 154(b) by 473 days.

(21) Appl. No.: 17/629,975

(22) PCT Filed: Jul. 28, 2020

(86) PCT No.: PCT/JP2020/028806
§ 371 (c)(1),
(2) Date: Jan. 25, 2022

(87) PCT Pub. No.: WO2021/029215
PCT Pub. Date: Feb. 18, 2021

(65) Prior Publication Data

US 2022/0251706 A1 Aug. 11, 2022

(30) Foreign Application Priority Data

Aug. 9, 2019 (JP) ................................ 2019-147033
Aug. 9, 2019 (JP) ................................ 2019-147034

(51) Int. Cl.
*C23C 16/455* (2006.01)
*C07F 17/00* (2006.01)
*C23C 16/18* (2006.01)
*C23C 16/40* (2006.01)

(52) U.S. Cl.
CPC ........ *C23C 16/45553* (2013.01); *C07F 17/00* (2013.01); *C23C 16/18* (2013.01); *C23C 16/407* (2013.01)

(58) Field of Classification Search
None
See application file for complete search history.

(56) References Cited

U.S. PATENT DOCUMENTS 5,276,010 A * 1/1994 Sasaki .................. C23C 14/541 427/126.3
8,747,965 B2 6/2014 Mogi et al.
2008/0119098 A1 5/2008 Palley et al.
2009/0001618 A1 1/2009 Kadokura et al.
(Continued)

FOREIGN PATENT DOCUMENTS

CN 103122454 A 5/2013
CN 106148914 A 11/2016
(Continued)

OTHER PUBLICATIONS

Notice of Reasons for Refusal issued on Aug. 16, 2022, by the Japanese Patent Office in corresponding Japanese Patent Application No. 2019-147034, and English translation. (6 pages).
Putkonen et al., "Organometallic Precursors for Atomic Layer Deposition," Topics in Organometallic Chemistry, (Aug. 27, 2005), vol. 9, pp. 125-145.
Office Action (Decision of Refusal) issued Feb. 28, 2023, by the Japan Patent Office in corresponding Japanese Patent Application No. 2019-147033 and an English translation of the Office Action. (9 pages).
(Continued)

*Primary Examiner* — Alexander M Weddle
(74) *Attorney, Agent, or Firm* — BUCHANAN INGERSOLL & ROONEY PC

(57) ABSTRACT

Provided are: bis(alkylcyclopentadienyl)tin or bis(alkyltetramethylcyclopentadienyl)tin having a high vapor pressure even at lower temperatures, typified by bis(ethylcyclopentadienyl)tin; a precursor for chemical vapor deposition containing any of the above-mentioned organotin compounds as a main component; and a method of producing a tin-containing thin film by an atomic layer deposition process using the precursor for chemical vapor deposition. A precursor for chemical vapor deposition containing bis(alkylcyclopentadienyl)tin or bis(alkyltetramethylcyclopentadienyl)tin represented by the following Formula (1) as a main component: (In Formula (1), $R^1$ and $R^2$ each independently represent hydrogen or an alkyl group having 6 or less carbon atoms, and $R^3$ and $R^4$ each independently represent an alkyl group having 6 or less carbon atoms.)

(1)

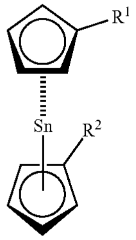

or

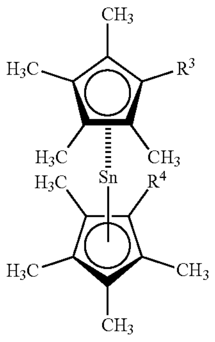

3 Claims, No Drawings

(56) References Cited

U.S. PATENT DOCUMENTS

| | | | | |
|---|---|---|---|---|
| 2011/0076513 | A1* | 3/2011 | Tsai | C23C 14/221 427/126.3 |
| 2013/0102110 | A1* | 4/2013 | Leschkies | H01L 31/03921 438/98 |
| 2013/0171341 | A1* | 7/2013 | Park | C07F 17/00 427/126.3 |
| 2014/0024814 | A1 | 1/2014 | Mogi et al. | |
| 2016/0333477 | A1* | 11/2016 | Nehlsen | C23C 16/45563 |

FOREIGN PATENT DOCUMENTS

| | | | | |
|---|---|---|---|---|
| JP | 62182279 | A * | 8/1987 | C23C 18/1216 |
| JP | S62182279 | A | 8/1987 | |
| JP | 2008091215 | A | 4/2008 | |
| JP | 2009030162 | A | 2/2009 | |
| JP | 2009227674 | A | 10/2009 | |
| JP | 2010-510392 | A | 4/2010 | |
| JP | 2012184449 | A | 9/2012 | |
| JP | 2013108178 | A | 6/2013 | |
| JP | 2018090586 | A | 6/2018 | |
| KR | 10-2013-0133880 | A | 12/2013 | |
| TW | 201238970 | A | 10/2012 | |
| WO | 2012132669 | A1 | 10/2012 | |

OTHER PUBLICATIONS

International Search Report (PCT/ISA/210) with an English translation, and Written Opinion (PCT/ISA/237) mailed on Sep. 24, 2020, by the Japanese Patent Office as the International Searching Authority for International Application No. PCT/JP2020/028806.

Office Action (Notice of Reasons for Refusal) issued on Jan. 5, 2024, in corresponding Japanese Patent Application No. 2023-069076 and English translation of the Office Action. (6 pages).

Office Action (Notification of the First Office Action) issued on Jun. 17, 2024, by the State Intellectual Property Office of People's Republic of China in corresponding Chinese Patent Application No. 202080056425.8, and an English Translation of the Office Action. (17 pages).

Office Action (Request for the Submission of an Opinion) issued on Jul. 31, 2024, by the Intellectual Property Office in corresponding Korean Patent Application No. 10-2022-7004822, and an English Translation of the Office Action. (10 pages).

Feng, L. et al. "Thin film technology and applications" Northwestern Polytechnical University Press, Feb. 29, 2016, pp. 177-179, with English translation.

* cited by examiner

BIS(ETHYLCYCLOPENTADIENYL)TIN, PRECURSOR FOR CHEMICAL VAPOR DEPOSITION, METHOD OF PRODUCING TIN-CONTAINING THIN FILM, AND METHOD OF PRODUCING TIN OXIDE THIN FILM

TECHNICAL FIELD

The present invention relates to: bis(ethylcyclopentadienyl)tin, which can be a precursor for chemical vapor deposition of a tin thin film and a tin oxide thin film; a precursor for chemical vapor deposition, in which bis(alkylcyclopentadienyl)tin or bis(alkyltetramethylcyclopentadienyl)tin is contained as a main component, and a method of producing a tin-containing thin film.

BACKGROUND ART

Transparent conductive films each have a high electric conductivity and a high optical transparency in visible light region, and thus they are used as the electrodes of various photoelectric transducers including photodetectors, in solar cells, flat panel displays, touch screens, or the like. Furthermore, transparent conductive films have excellent reflection and absorption characteristics in the near-infrared region, and thus they are also used as heat-ray reflection films, transparent heaters, transparent electromagnetic wave shields, antistatic films, or the like.

Examples of materials commonly used for such a transparent conductive film include: tin(IV) oxide ($SnO_2$) that contains antimony, fluorine, or the like as a dopant; zinc oxide (ZnO) that contains aluminum, gallium, indium, tin, or the like as a dopant; and indium(III) oxide ($In_2O_3$) that contains tin, tungsten, titanium, or the like as a dopant. Particularly, indium oxide films containing tin as a dopant (ITO), that a low-resistance transparent conductive film can be easily obtained among them, are widely used industrially.

Such transparent conductive oxide films are produced by using a process such as a sputtering process, a chemical vapor deposition process, or an ion plating process. Among these oxide films, a thin oxide film of the metal which has a precursor with a relatively high vapor pressure, such as tin oxide or zinc oxide, can be easily formed by a chemical vapor deposition process (CVD process) such as an atomic layer deposition process (ALD process).

In most cases, tetraalkyltin, which is a tetravalent tin compound, is extensively used as a tin precursor. Besides tetraalkyltin, a divalent tin complex such as a tin aminoalkoxide complex, for example, is disclosed as a precursor for tin and tin oxide thin films in Patent Literature 1. Using the tin aminoalkoxide complex, in which a dialkylamino group, as a new ligand, is coordinated to tin, tin and tin oxide thin films free from carbon or halogen contamination are formed. And the complex is improved in its thermal stability and volatility. Further, tin and tin oxide thin films are easily formed even at lower temperatures.

Patent Literature 2 discloses bis(diisopropylamino)dimethyltin ($Sn[N(^iPr)_2]_2Me_2$) as a precursor for tin and tin oxide thin films. Furthermore, a divalent tin complex, N,N'-tert-butyl-1,1-dimethylethylenediamine stannylene is used in Non-Patent Literature 1.

CITATION LIST

Patent Literature

Patent Literature 1: JP 2009-227674 A
Patent Literature 2: JP 2018-90586 A

Non Patent Literature

Non-Patent Literature 1: Jung-Hoon Lee, Mi Yoo, DongHee Kang, Hyun-Mo Lee, Wan-ho Choi, Jung Woo Park, Yeonjin Yi, Hyun You Kim, and Jin-Seong Park, ACS Applied Materials & Interfaces 10 (39), 33335-33342 (2018)

SUMMARY OF INVENTION

Technical Problem

However, the tin aminoalkoxide complex of Patent Literature 1 has a relatively strong Sn—O bond or Sn—N bond between tin atom and the ligand. In addition, since the vapor pressure of the tin aminoalkoxide complex is $10^{-2}$ torr (1.3 Pa) at 100 to 120° C., it is desired to increase the vapor pressure for enhancing the reactivity in terms of process efficiency in order to form large-area tin or tin oxide thin films using chemical vapor deposition process.

Otherwise, the tin complex of Patent Literature 2 has a relatively high vapor pressure of 0.6 torr (79.9 Pa) at 80° C., but is difficult to deposit a film of tin(II) oxide since the tin is in the tetravalent state. Tetraalkyltin, which is extensively used, is also in the tetravalent state, and hence is difficult to deposit a film of tin(II) oxide as well. Furthermore, the vapor pressure of the tin complex of Non-Patent Literature 1 is 0.2 torr (26.6 Pa) at 75° C., but this complex also has a relatively strong Sn—N bond between tin atom and a ligand as is the case in Patent Literature 1.

An object of the present invention is to provide bis(ethylcyclopentadienyl)tin, which is liquid at room temperature and has a high vapor pressure, as a precursor of a tin thin film or a tin oxide thin film.

In addition, an object of the present invention is to provide: bis(alkylcyclopentadienyl)tin or bis(alkyltetramethylcyclopentadienyl)tin, which has a high vapor pressure even at lower temperatures, as a precursor for a tin thin film or a tin oxide thin film; a precursor for chemical vapor deposition including any of the above-mentioned precursors as a main component; and a method of producing a tin-containing thin film by ALD process using the precursor for chemical vapor deposition.

Solution to Problem

The present invention includes the following items.

The bis(ethylcyclopentadienyl)tin of the present invention is a compound represented by the chemical formula $Sn[C_5H_4(C_2H_5)]_2$.

The precursor for chemical vapor deposition of the present invention is characterized by that the precursor for chemical vapor deposition contains bis(alkylcyclopentadienyl)tin or bis(alkyltetramethylcyclopentadienyl)tin represented by the following Formula (1) as a main component.

[Chemical Formula 1]

(1)

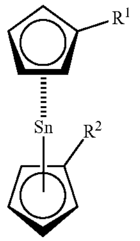

or

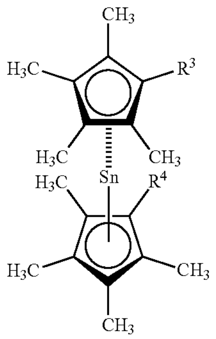

In Formula (1), $R^1$ and $R^2$ each independently represent hydrogen or an alkyl group having 6 or less carbon atoms, and $R^3$ and $R^4$ each independently represent an alkyl group having 6 or less carbon atoms.

The precursor for chemical vapor deposition is preferably liquid at 23° C.

The precursor for chemical vapor deposition of the present invention having the above composition has a high vapor pressure, and hence is suitably used for thin film formation by CVD or ALD.

The method of producing tin-containing thin film of the present invention features that a tin-containing thin film is formed by ALD process using the precursor for chemical vapor deposition in which bis(alkylcyclopentadienyl)tin or bis(alkyltetramethylcyclopentadienyl)tin represented by Formula (1) is contained as a main component.

The method of producing tin(II) oxide thin film of the present invention features that a tin(II) oxide thin film is formed by ALD process using the precursor for chemical vapor deposition in which bis(alkylcyclopentadienyl)tin or bis(alkyltetramethylcyclopentadienyl)tin represented by Formula (1) is contained as a main component.

Advantageous Effects of Invention

The bis(ethylcyclopentadienyl)tin of the present invention is a novel compound. It is liquid at room temperature (23° C.), and has a high vapor pressure even at lower temperatures such as a pressure of 2.3 torr (306.6 Pa) at 100° C. Therefore, the bis(ethylcyclopentadienyl)tin of the present invention is suitable for a precursor to be used in metalorganic chemical vapor deposition (MOCVD), low-pressure chemical vapor deposition (LPCVD), plasma-enhanced chemical vapor deposition (PECVD), or atomic layer deposition (ALD), for example, and is particularly suitable for a precursor to be used in ALD.

According to the present invention, when bis(alkylcyclopentadienyl)tin or bis(alkyltetramethylcyclopentadienyl)tin is used as a precursor having a high vapor pressure, and with an appropriately selected oxidizing agent, an n-type or p-type tin oxide thin film can be efficiently formed by chemical vapor deposition, specifically, ALD.

Since the bis(alkylcyclopentadienyl)tin or bis(alkyltetramethylcyclopentadienyl)tin of the present invention is in the divalent state, it is possible to produce either tin(IV) oxide or tin(II) oxide, depending on the oxidizing agent when ALD is performed. In particular, the bis(alkylcyclopentadienyl)tin or bis(alkyltetramethylcyclopentadienyl)tin is suitable to form a tin(II) oxide thin film which is a p-type transparent electroconductive film by ALD. Furthermore, it is also possible to perform ALD of metallic tin with the use of a reducing agent.

DESCRIPTION OF EMBODIMENTS

The bis(ethylcyclopentadienyl)tin ($Sn[C_5H_4(C_2H_5)]_2$) of the present invention is a compound represented by the following structural formula. Note that, the following structural formula represents a sterically stable structure of bis(ethylcyclopentadienyl)tin, but it actually includes bis (ethylcyclopentadienyl)tin in which an ethylcyclopentadienyl ligand is not penta-hapto also.

[Chemical Formula 2]

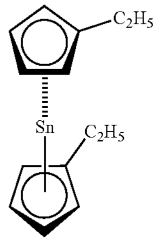

Tin can usually be in the divalent or tetravalent state having an oxidation number of +2 or +4, respectively. A divalent tin compound has a ionic bond and a reducing property, and a tetravalent tin compound has a covalent bond. The bis(ethylcyclopentadienyl)tin of the present invention is a divalent tin compound.

The bis(ethylcyclopentadienyl)tin of the present invention can be produced by various methods. As an example, bis(ethylcyclopentadienyl)tin can be obtained as follows: a tetrahydrofuran (THF) solution of tin(II) chloride is added at a temperature of −78° C. to a solution in which ethylcyclopentadiene and metallic potassium are dissolved in THF, the mixture is stirred and then distilled under reduced pressure, whereby bis(ethylcyclopentadienyl)tin can be obtained as a yellow liquid product in high yield.

When the bis(ethylcyclopentadienyl)tin of the present invention is used as a precursor for CVD, such as MOCVD, LPCVD, PECVD, or ALD, a tin-containing thin film can be formed.

In order to perform these chemical vapor deposition processes, it is required to use a compound that is easily vaporized even at lower temperatures as a precursor. In this regard, the bis(ethylcyclopentadienyl)tin of the present invention is liquid at 23° C. In addition, the bis(ethylcyclopentadienyl)tin has a vapor pressure of 2.3 torr (306.6 Pa) at 100° C., and thus has a high vapor pressure even at a lower temperature. Therefore, the bis(ethylcyclopentadienyl)tin is suitable to form a thin film by the above-described various CVD, particularly by ALD.

Note that, bis(cyclopentadienyl)tin is solid at room temperature, and has a vapor pressure of 0.1 torr (13.3 Pa) at 80° C., which is considerably lower than that of bis(ethylcyclopentadienyl)tin.

As an example, a method of forming a thin film by a chemical vapor deposition process using bis(ethylcyclopentadienyl)tin as a precursor will be described.

In CVD, a precursor vessel into which bis(ethylcyclopentadienyl)tin is filled is heated to vaporize bis(ethylcyclopentadienyl)tin, which is fed to a reaction chamber. The vaporization can be performed as in a usual method of vaporizing an organometallic compound in CVD; for example, heating and depressurization are carried out in a precursor vessel in a CVD apparatus. In order to feed bis(ethylcyclopentadienyl)tin to a substrate in the reaction chamber, a piping from the precursor vessel to the reaction chamber and the reaction chamber are kept at a temperature at which bis(ethylcyclopentadienyl)tin as a precursor is not thermally decomposed and maintains its gaseous state, that is, a temperature higher than the temperature of the precursor vessel (the temperature at which the precursor is vaporized) and lower than the temperature at which the precursor is thermally decomposed. When the bis(ethylcyclopentadienyl)tin of the present invention is used, the heating temperature is approximately from 23 to 200° C. In order to increase the degree of freedom in adjustment of the deposition temperature (the substrate temperature), the heating temperature is preferably as low as possible. Therefore, it can be said that bis(ethylcyclopentadienyl)tin having a high enough vapor pressure at lower temperatures is suitable for CVD.

Examples of the chemical vapor deposition process include: thermal CVD process in which a continuous thermal decomposition and deposition take place on a substrate, such as MOCVD; and ALD process in which atomic layers are deposited one layer by one layer. In the present invention, ALD is preferable.

In ALD, the deposition of a thin film of tin(II) oxide or tin(IV) oxide is controlled by one atomic layer through a surface reaction on the substrate by alternately feeding bis(ethylcyclopentadienyl)tin and an oxidizing agent. Examples of the oxidizing agent to be used include: water, ozone, and plasma-activated oxygen. When water is used for the oxidizing agent, a thin film of tin(II) oxide which is a p-type transparent electroconductive film is formed, and when ozone or plasma-activated oxygen is used, a thin film of tin(IV) oxide which is an n-type transparent electroconductive film is formed.

The precursor for chemical vapor deposition of the present invention contains bis(alkylcyclopentadienyl)tin represented by the following Formula (1) or bis(alkyltetramethylcyclopentadienyl)tin represented by the following Formula (1) as a main component.

[Chemical Formula 3]

(1)

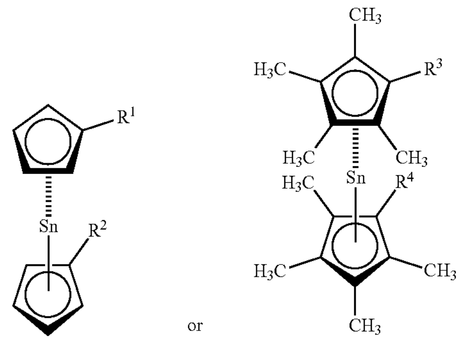

The bis(alkylcyclopentadienyl)tin or bis(alkyltetramethylcyclopentadienyl)tin represented by Formula (1) is a divalent tin compound. Therefore, they make a stronger ionic bond and have a high reducing property.

In Formula (1), $R^1$ and $R^2$ each independently represent hydrogen or an alkyl group having 6 or less carbon atoms, and $R^3$ and $R^4$ each independently represent an alkyl group having 6 or less carbon atoms. When the number of carbon atoms is too large, the precursor becomes bulky and the amount of adsorption during ALD is decreased, and thus $R^1$, $R^2$, $R^3$, and $R^4$ of the present invention have 6 or less carbon atoms, preferably 4 or less carbon atoms.

Examples of the alkyl group having 4 or less carbon atoms include a methyl group, an ethyl group, a n-propyl group, an isopropyl group, a n-butyl group, an isobutyl group, a sec-butyl group, and a tert-butyl group.

Both of $R^1$ and $R^2$ are preferably hydrogen or an alkyl group having the same number of carbon atoms which is 6 or less, more preferably an alkyl group having 2 or 3 carbon atoms, and particularly preferably an ethyl group having 2 carbon atoms.

Both of $R^3$ and $R^4$ preferably have the same number of carbon atoms which is 6 or less, are more preferably an alkyl group having from 1 to 3 carbon atoms, and particularly preferably a methyl group having 1 carbon atom.

Furthermore, from the viewpoint of the amount of adsorption in ALD, bis(alkylcyclopentadienyl)tin is preferable to bis(alkyltetramethylcyclopentadienyl)tin.

The precursor for chemical vapor deposition of the present invention may be a solid or a liquid as long as it has a high vapor pressure and is easily vaporized when chemical vapor deposition is performed, but it is preferably liquid at 23° C. from the perspective of improving the process efficiency. Therefore, the melting point of bis(alkylcyclopentadienyl)tin or bis(alkyltetramethylcyclopentadienyl)tin, which is the main component of the precursor for chemical vapor deposition, is less than 35° C., preferably less than 30° C., and more preferably less than 23° C.

Note that, the bis(cyclopentadienyl)tin whose $R^1$ and $R^2$ being hydrogen is solid at 23° C., and has a vapor pressure of 0.1 torr (13.3 Pa) at 80° C.; the bis(ethylcyclopentadienyl) tin whose $R^1$ and $R^2$ being ethyl groups is liquid at 23° C., and has a vapor pressure of 1.2 torr (159.9 Pa) at 80° C., and a vapor pressure of 2.3 torr (306.6 Pa) at 100° C.

In order to perform chemical vapor deposition, a compound having a high vapor pressure is required to be used for a precursor. It is preferable that the precursor for chemical vapor deposition of the present invention is liquid at 23° C. and has a high vapor pressure even at lower temperatures. The bis(alkylcyclopentadienyl)tin or bis(alkyltetramethylcyclopentadienyl)tin represented by Formula (1) in the present invention has a vapor pressure of from 0.05 to 10 torr (from 6.6 to 1333.2 Pa) at 80° C., and thus is suitable for thin film formation by CVD, particularly by ALD.

In the precursor for chemical vapor deposition, the content of bis(alkylcyclopentadienyl)tin or bis(alkyltetramethylcyclopentadienyl)tin represented by Formula (1) is preferably closer to 100 wt %. Specifically, the content of bis(alkylcyclopentadienyl)tin or bis(alkyltetramethylcyclopentadienyl)tin in the precursor for chemical vapor deposition is preferably from 95 to 100 wt %, and more preferably from 99 to 100 wt %. However, there may exist, as long as the object of the present invention is not hindered, a substance that does not react with bis(alkylcyclopentadienyl)tin or bis(alkyltetramethylcyclopentadienyl)tin and that is not vaporized at a temperature at which the precursor is vaporized when the chemical vapor deposition is performed.

The precursor for chemical vapor deposition of the present invention can be produced by various methods. The method of producing bis(ethylcyclopentadienyl)tin whose $R^1$ and $R^2$ being ethyl groups, for example, is as described above.

The thin film formation with the use of the precursor for chemical vapor deposition of the present invention is performed by CVD process.

In CVD, a precursor vessel into which bis(alkylcyclopentadienyl)tin or bis(alkyltetramethylcyclopentadienyl)tin represented by Formula (1) is filled is heated to vaporize the bis(alkylcyclopentadienyl)tin or bis(alkyltetramethylcyclopentadienyl)tin, which is fed to a reaction chamber. The vaporization can be performed as in a usual method of vaporizing an organometallic compound in CVD, for example, heating and depressurization are carried out in a precursor vessel in a CVD apparatus. Then the vaporized bis(alkylcyclopentadienyl)tin or bis(alkyltetramethylcyclopentadienyl)tin is fed to a substrate in the reaction chamber. At this time, a piping from the precursor vessel to the reaction chamber and the reaction chamber are kept at a temperature at which bis(alkylcyclopentadienyl)tin or bis(alkyltetramethylcyclopentadienyl)tin as a precursor is not thermally decomposed and maintains its gaseous state, that is, a temperature higher than the temperature of the precursor vessel (the temperature at which the precursor is vaporized) and lower than the temperature at which the precursor is thermally decomposed. In the case of the chemical vapor deposition process in the present invention, the heating temperature is approximately from 23 to 200° C. In order to increase the degree of freedom in adjustment of the deposition temperature (the substrate temperature), the heating temperature is preferably as low as possible. Therefore, it can be said that the precursor for chemical vapor deposition preferably has a high enough vapor pressure at lower temperatures.

Examples of the chemical vapor deposition process include: thermal CVD process in which continuous thermal decomposition and deposition take place on a substrate, such as MOCVD; and ALD process in which atomic layers are deposited one layer by one layer. The precursor for chemical vapor deposition of the present invention is particularly preferable for ALD process, although it is suitable for the thermal CVD process as well.

In ALD, a precursor for chemical vapor deposition and an oxidizing agent are alternately fed, whereby the deposition of a thin film of tin(II) oxide or tin(IV) oxide is controlled by one atomic layer through a reaction between bis(alkylcyclopentadienyl)tin or bis(alkyltetramethylcyclopentadienyl)tin and the oxidizing agent on the substrate. Examples of the oxidizing agent to be used include: water, ozone, and plasma-activated oxygen. When water is used for the oxidizing agent, a thin film of tin(II) oxide which is a p-type transparent electroconductive film is formed, and when ozone or plasma-activated oxygen is used, a thin film of tin(IV) oxide which is an n-type transparent electroconductive film is formed.

In ALD, the deposition is carried out by repeating a deposition cycle including steps of (i) introducing a vapor phase precursor for chemical vapor deposition into a chamber in which a substrate is disposed on a heater whereby the vapor phase precursor is adsorbed on the substrate, (ii) purging any excess precursor for chemical vapor deposition in the chamber with an inert gas, (iii) adding a vapor phase oxidizing agent to allow the oxidizing agent to react with bis(alkylcyclopentadienyl)tin or bis(alkyltetramethylcyclopentadienyl)tin on the substrate thereby forming a tin oxide, and (iv) purging any excess oxidizing agent in the chamber with an inert gas. The number of the deposition cycles varies depending on the area of the substrate and the thickness of a tin-containing thin film, but is typically from 100 to 10000.

The deposition temperature is adjusted such that a substrate temperature is the same as a reaction temperature, and the substrate temperature is lower than the temperature at which an adsorbed bis(alkylcyclopentadienyl)tin or bis(alkyltetramethylcyclopentadienyl)tin is thermally decomposed and is high enough to sufficiently react with an oxidizing agent.

Note that, a precursor for chemical vapor deposition and an oxidizing agent in the vapor phase are fed from the outside to a reaction chamber in which a substrate is placed, but are required to be sublimated or be evaporated at a temperature lower than the substrate temperature so as not to condense on the substrate. At this time, when the precursor for chemical vapor deposition is solid at room temperature, it is difficult for a flow rate control device to control the feed rate of the precursor in the vapor phase; when the precursor for chemical vapor deposition is liquid at room temperature, it is possible for the flow rate control device to precisely and easily control the feed rate of the precursor in the vapor phase, and thus it can be said that the precursor for chemical vapor deposition which is liquid at room temperature is suitable for ALD.

EXAMPLES

Hereinafter, the present invention will be described more specifically based on Examples, but the present invention is not limited to the following Examples.

[Example 1] Bis(ethylcyclopentadienyl)tin (Sn[$C_5H_4$ ($C_2H_5$)]$_2$)

Into a 1 L four-necked flask were added 400 ml of THF, 21.7 g (0.55 mol) of metallic potassium, and 70.8 g (0.75 mol) of ethylcyclopentadiene ($C_5H_5(C_2H_5)$), and the mixture was allowed to react for 26 hours, then distilled off under reduced pressure at 40° C. to give $C_5H_4(C_2H_5)K$.

To the resultant $C_5H_4(C_2H_5)K$ were added 600 ml of THF and 50.7 g (0.27 mol) of $SnCl_2$ at −78° C., and the mixture was stirred at room temperature for 23 hours. Then the mixture was distilled off under reduced pressure at 50° C. to give a solid content.

The resultant solid content was vacuum distilled twice at 110° C. and 0.1 torr (13.3 Pa) to afford a yellow liquid. The yield was 61.3 g (0.20 mol) in 76.2% (based on $SnCl_2$).

The obtained sample was analyzed according to the following (1) to (3), whereby the sample was identified as Sn[$C_5H_4$ ($C_2H_5$)]$_2$.

(1) Composition Analysis

As a result of ICP atomic emission spectrometry for a liquid obtained by wet decomposition of the sample, the content of Sn was found to be 38.2% (theoretical value: 38.9%).

(2) $^1$H-NMR

Measurement conditions (Instrument: AVANCE NEO 500 (500 MHz), Bruker BioSpin GmbH, solvent: THF-d8, method: 1D)

$CH_2\underline{CH_3}$, 1.15 (6H, triplet) ppm: $C\underline{H_2}CH_3$, 2.48 (4H, quartet) ppm: $C_5\underline{H_4}$, 5.71 (4H, multiplet) ppm: $C_5\underline{H_4}$, 5.79 (4H, multiplet) ppm (3) $^{13}$C-NMR Measurement conditions (Instrument: AVANCE NEO 500 (125 MHz), Bruker BioSpin GmbH, solvent: THF-d8, method: 1D)

133.61, 110.31, 108.37 ppm: $C_5$, 22.53, 16.88 ppm: $C_2H_5$

Next, the vapor pressure at from 70 to 130° C. was directly measured using a pressure gauge (Model: 121A, Manufacturer: MKS Instruments, Inc.) to give the following formula.

$$\log P\ (\text{torr}) = -1930/T(K) + 5.54$$

Based on this formula, the vapor pressure at 80° C. was determined to be 1.2 torr (159.9 Pa), and the vapor pressure at 100° C. was determined to be 2.3 torr (306.6. Pa).

It can be said that $Sn[C_5H_4(C_2H_5)]_2$ has a high vapor pressure and has the volatility required for the chemical vapor deposition.

In addition, the synthesized $Sn[C_5H_4(C_2H_5)]_2$ reacted with water at room temperature to yield a white solid. This indicates that water can be used as an oxidizing agent, and it can be said that ALD can suitably form a thin film of tin(II) oxide, which is a p-type transparent electroconductive film.

[Example 2] Dicyclopentadienyltin ($Sn(C_5H_5)_2$)

Dicyclopentadienyltin is not a novel substance, as is also shown in a literature of Christoph Janiak, Z. Anorg. Allg. Chem. 2010, 636, 2387-2390, but there are no reports of using it as a precursor for chemical vapor deposition. According to the above-mentioned literature, $Sn(C_5H_5)_2$ is solid at room temperature, but has been able to be purified by sublimation at 80° C. and 0.1 torr (13.3 Pa), and has performance required for chemical vapor deposition.

[Comparative Example 1] Bis(dimethylamino-2-methyl-2-propoxy)tin [$Sn(dmamp)_2$]

In Patent Literature 1, the synthesis was performed according to the following method.

Into a 250 mL Schlenk flask were added 1 g (5.27 mmol) of tin(II) chloride ($SnCl_2$), 1.76 g (10.54 mmol) of lithium bis(trimethylsilyl)amide (Li(btsa)), and 50 mL of ether, thereafter the mixed solution was stirred at room temperature for 3 hours. After the mixed solution was filtered to remove lithium chloride (LiCl), the solvent was removed from the residual solution under vacuum, followed by fractional distillation at 100° C., 0.01 torr (1.3 Pa) to give bis[bis(trimethylsilyl)amino]tin ($Sn(btsa)_2$). Then, 0.53 g (4.56 mmol) of 2 equivalents of 1-(dimethylamino)-2-methyl-2-propanol was gradually added to a solution in which 1 g (2.28 mmol) of $Sn(btsa)_2$ is dissolved in n-hexane, and the mixture was stirred at room temperature for 6 hours.

After the removal of the solvent under vacuum, fractional distillation was performed at 100° C., 0.01 torr (1.3 Pa) to yield a pure $Sn(dmamp)_2$ complex in 91%.

From the pressure during the fractional distillation, the vapor pressure at 100° C. is found to be 0.01 torr (1.3 Pa). The bis(dimethylamino-2-methyl-2-propoxy)tin has a vapor pressure extremely lower than that of the substances of the present invention, and is difficult to be used for chemical vapor deposition only by the vapor pressure, and some contrivance such as use of a bubbler is required.

Comparative Example 2

Tetraethyltin is extensively used as a precursor for Sn in ALD, and has a high vapor pressure. However, tetraethyltin has a problem of its high toxicity. In addition, tetraethyltin is a tetravalent compound, and is difficult to form a thin film of tin(II) oxide by ALD.

(1)

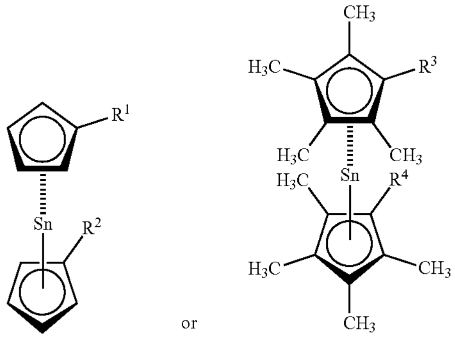

The invention claimed is:

1. A method of producing a tin-containing thin film by an atomic layer deposition process comprising the steps of heating to vaporize a precursor in which bis(alkylcyclopentadienyl)tin or bis(alkyltetramethylcyclopentadienyl)tin represented by the following Formula (1) is contained in an amount from 95 to 100 wt % of the precursor, wherein the heating occurs in a precursor vessel, and introducing the vaporized bis(alkylcyclopentadienyl)tin or bis(alkyltetramethylcyclopentadienyl)tin maintaining its gaseous state into a chamber in which a substrate is disposed on a heater to be adsorbed on the substrate, (1)

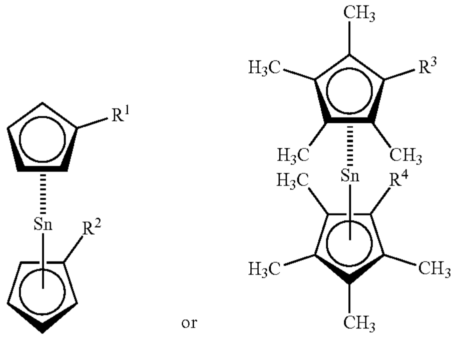

in Formula (1), $R^1$ and $R^2$ each independently represent hydrogen or an alkyl group having 6 or less carbon atoms, and $R^3$ and $R^4$ each independently represent an alkyl group having 6 or less carbon atoms.

2. A method of producing a tin (II) oxide thin film by an atomic layer deposition process comprising the steps of heating to vaporize a precursor in which bis(alkylcyclopentadienyl)tin or bis(alkyltetramethylcyclopentadienyl)tin represented by the following Formula (1) is contained in an amount from 95 to 100 wt % of the precursor, wherein the heating occurs in a precursor vessel, and introducing the vaporized bis(alkylcyclopentadienyl)tin or bis(alkyltetramethylcyclopentadienyl)tin maintaining its gaseous state into a chamber in which a substrate is disposed on a heater to be adsorbed on the substrate, (1)

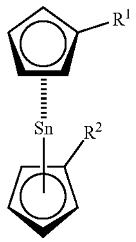

or

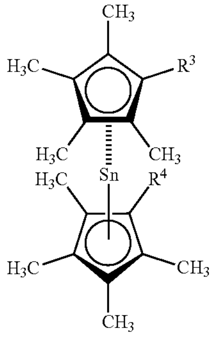

in Formula (1), $R^1$ and $R^2$ each independently represent hydrogen or an alkyl group having 6 or less carbon atoms, and $R^3$ and $R^4$ each independently represent an alkyl group having 6 or less carbon atoms.

3. The method according to claim 1, further comprising introducing an oxidizing agent into the chamber after the step of introducing the vaporized bis(alkylcyclopentadienyl) tin or bis(alkyltetramethylcyclopentadienyl)tin, wherein the oxidizing agent comprises water, ozone, or plasma-activated oxygen.

* * * * *